United States Patent [19]

Wu

[11] Patent Number: 6,118,160

[45] Date of Patent: Sep. 12, 2000

[54] STRUCTURE OF A MASK ROM DEVICE ON A SEMICONDUCTOR SUBSTRATE HAVING A CELL AREA FOR CODING

[75] Inventor: Shye-Lin Wu, Hsinchu, Taiwan

[73] Assignee: Texas Instruments - Acer Incorporated, Hsinchu, Taiwan

[21] Appl. No.: 09/088,457

[22] Filed: Jun. 1, 1998

[51] Int. Cl.[7] .................................................. H01L 27/112
[52] U.S. Cl. ............................................. 257/391; 257/437
[58] Field of Search .................................... 257/390, 391, 257/437

[56] References Cited

U.S. PATENT DOCUMENTS

| | | | |
|---|---|---|---|
| 5,329,483 | 7/1994 | Wada et al. ............................. | 257/390 |
| 5,538,906 | 7/1996 | Aoki ........................................... | 437/29 |
| 5,567,970 | 10/1996 | Sheu et al. ............................... | 257/644 |
| 5,683,925 | 11/1997 | Irani et al. ................................ | 437/45 |

*Primary Examiner*—David Hardy
*Attorney, Agent, or Firm*—Harness, Dickey & Pierce, P.L.C.

[57] ABSTRACT

The present invention includes NMOS devices on a NMOS device area and coded NMOS devices on a cell area. Isolation structures are formed between the NMOS devices and between the coded NMOS devices. N conductive type bit lines are formed under first isolation structures. A coding region is formed on the cell area between two coded NMOS devices and under a second isolation structure. Spacers are formed on the side walls of the NMOS devices and the coded NMOS devices and an anti-reflective coating layer is formed on the NMOS devices and the coded NMOS devices.

14 Claims, 5 Drawing Sheets

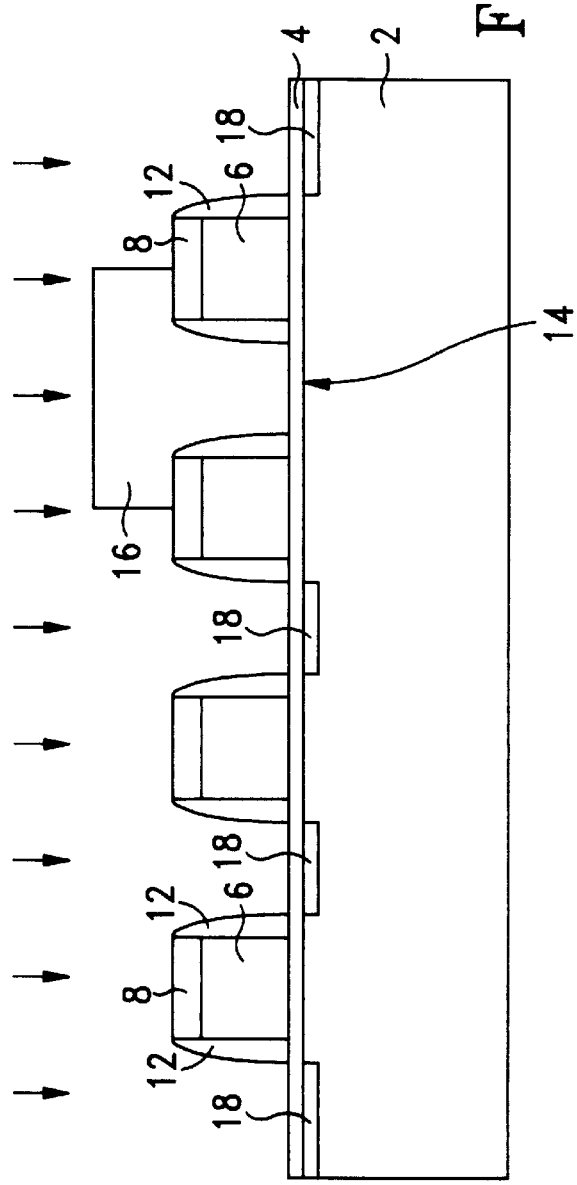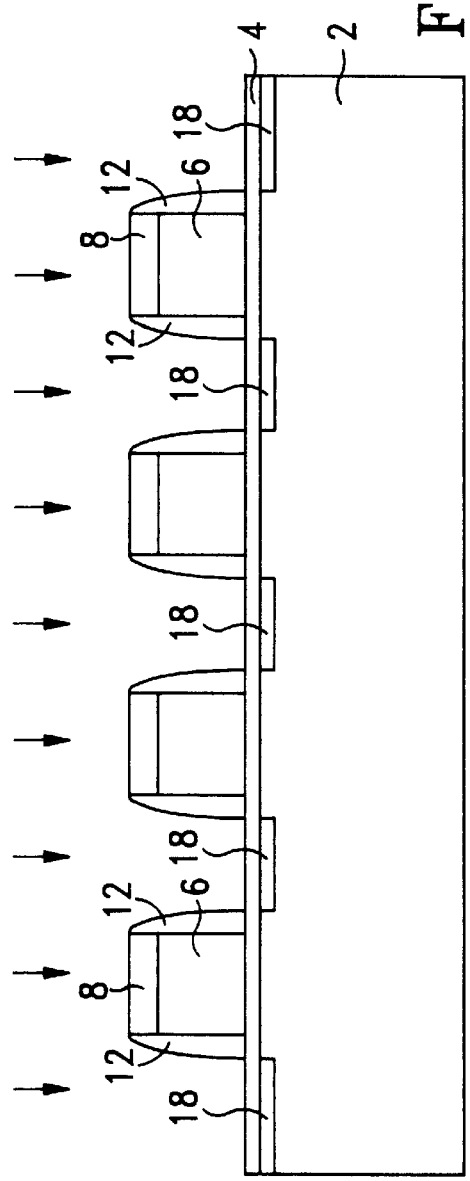

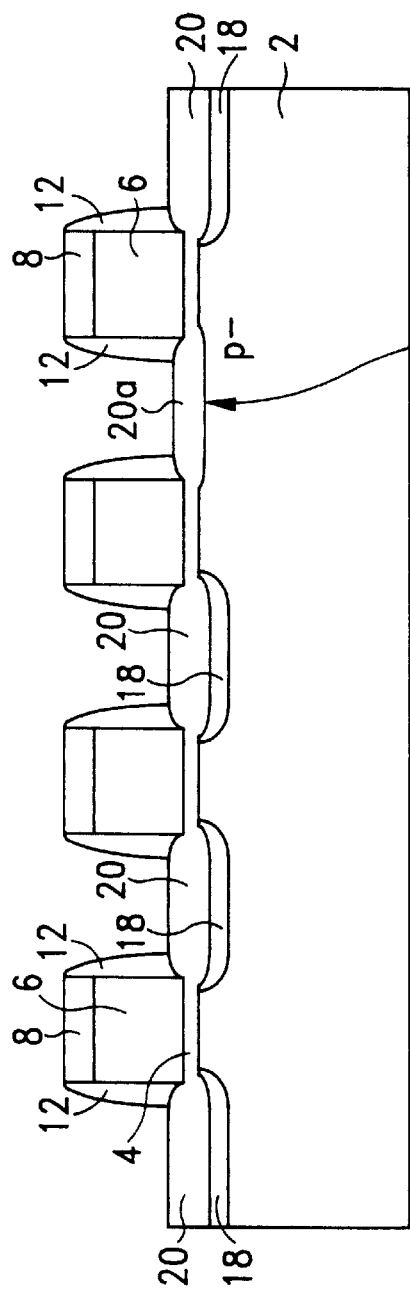
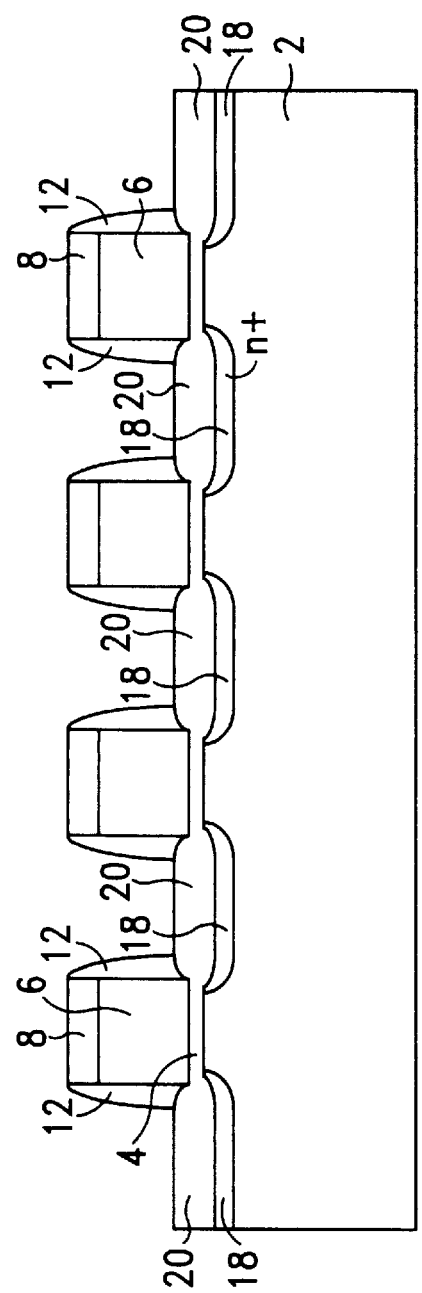
FIG.6A
FIG.6B

STRUCTURE OF A MASK ROM DEVICE ON A SEMICONDUCTOR SUBSTRATE HAVING A CELL AREA FOR CODING

FIELD OF THE INVENTION

The present invention relates to semiconductor devices, specifically to mask read only memories (ROM).

BACKGROUND

Recently, significant advances have been made to meet the need for Ultra Large Scale Integrated (ULSI) circuits. Memory devices are continuously driven by new applications. For example, computer interfaces will be operated by speech processing or vision processing, and other communication interfaces, all of which require a lot of memory. Read only memory (ROM) devices include ROM cells for coding data and a periphery controlling devices to control the operation of the cells. Each bit of data is stored in a cell, which is a single n-channel transistor or a ROM cell.

Typically, mask ROM includes devices with different threshold voltages. A type of device is formed in an active area and another type of device with a threshold voltage mask formed in another active area during the process. In MOS transistors for mask ROM, the threshold voltages of the channel regions under the gates are set to the same before data writing. Thereafter, ions are selectively implanted into determined regions to differentiate the threshold voltages thereof for data writing.

One of the methods that involves differentiating the threshold voltages is achieved by ion implantation of some of the transistor gates. This method raises the threshold voltage of the n-channel device by doping boron with a heavy dose. This method is so called threshold voltage programming. There are two other methods for programming which are known as field oxide programming and through-hole programming. Each of the programming methods can be implemented at different stages of the process.

In order to achieve the above object, it is known to different threshold voltages by ion implantation through sacrificing oxide into a silicon substrate. For example, in U.S. Pat. No. 5,538,906, Hitoshi proposes a method to form devices with different threshold voltages. However, the high dose boron implantation will result in a lower junction leakage breakdown voltage of the coded MOS and more importantly to a very high band-to-band leakage current as mentioned in U.S. Pat. No. 5,683,925. As the gate is decreased, the oxide must be made thinner in order to provide the same threshold voltage. The higher dosage for changing the threshold voltage, the more band-to-band current is generated per cell. Thus, Rustom et al. disclose a method of forming ROM without increasing significant band-to-band leakage. The present invention proposes an easier way to manufacture the ROM without additional channel coding implantation.

SUMMARY

The present invention includes a plurality of NMOS devices formed on a NMOS device area and a plurality of coded NMOS devices formed on a cell area. A plurality of first isolation structures are formed on the semiconductor substrate between the NMOS devices and between the coded NMOS devices. N conductive type bit lines are formed under first isolation structures. A coding region is formed on the cell area between two adjacent coded NMOS devices and under a second isolation structure. Spacers are formed on the side walls of the NMOS devices and the coded NMOS devices and an anti-reflective coating layer is formed on the NMOS devices and the coded NMOS devices. The thickness of the second isolation structure on the coding region is thinner than first isolation structures on the bit lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5A and FIG. 5B are cross-sectional views of a semiconductor substrate illustrating the step of performing an ion implantation to the semiconductor substrate according to the present invention.

FIG. 6A and FIG. 6B are cross-sectional views of a semiconductor substrate illustrating the step of performing a thermal oxidation to the semiconductor substrate according to the present invention.

DETAILED DESCRIPTION

Figure 1:
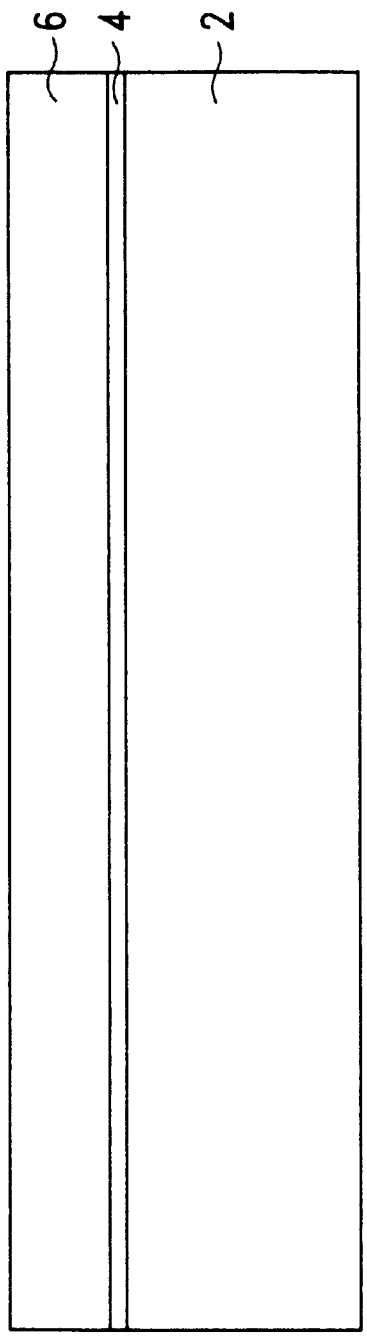
FIG. 1 is a cross-sectional view of a semiconductor substrate illustrating the steps of forming a gate oxide layer and a polysilicon layer on the semiconductor substrate according to the present invention.

The present invention proposes a novel method to fabricate NMOS transistors with two different threshold voltages for mask ROM devices. The detailed description is follows. Turning to FIGS. 6A and 6B, a mask ROM (read only memory) device is formed on a semiconductor substrate 2 having a cell area for coding, and a NMOS device area. FIG. 6A indicates the profile in accordance with the cell area including the coding region 14, whereas FIG. 6B indicates the profile in accordance with the periphery area consisting of n-channel MOS transistors.

A plurality of NMOS devices are formed on the NMOS device area and a plurality of coded NMOS devices are formed on the cell area. The mask ROM also includes a plurality of first isolation structures 20 formed on the semiconductor substrate 2 between the NMOS devices and between the coded NMOS devices. N conductive type bit lines 18 are formed under the first isolation structures 20.

A coding region 14 is formed on the cell area between two adjacent coded NMOS devices and under a further isolation structure 20a. In the embodiment, the coding region 14 has p conductive type ions doped therein. Spacers are formed on the side walls of the NMOS devices and the coded NMOS devices and an anti-reflective coating layer is formed on the NMOS devices and the coded NMOS devices.

Further, the thickness of the second isolation structure 20a on the coding region 14 is thinner than the one of the first isolation structures 20. This can be achieved by doping ions into the substrate 2 with a photoresist 16 on the coding region 14, as shown in FIG. 5A. As is known in the art, the oxidation rate of silicon with ions is faster than the area without dopant. Turning to FIG. 6A and FIG. 6B, the thickness of the isolations structure 20a on the coding region 14 is about 300 to 2000 angstroms, whereas the thickness of the isolation structures 20 on the bit lines 18 is about 500 to 3500 angstroms. The formation of the mask ROM is as follows.

Referring to FIG. 1, a single crystal substrate with a <100> crystallographic orientation is used for the preferred embodiment. Isolation regions (not shown) are created for the purposes of isolation. In this case, FOX (field oxide) regions are created to achieve the purpose. Typically, the memory device includes a cell area surrounded by a periphery area consisting of n-channel transistors. The cell area includes a multiplicity of ROM transistors. Therefore, the first step of the present invention is to create transistors on the substrate 2 both in the cell area and in the periphery area. In order to achieve this, gate structures are defined by means of conventional processes. For example, a thin oxide layer 4 is formed on the substrate 2 to act as a gate oxide by using an oxygen-steam ambient, at a temperature between about 800 to 1100 degrees centigrade. Alternatively, the gate oxide 4 may be formed using other known oxide chemical compositions and procedures. In the preferred embodiment, the thickness of the gate oxide layer 4 is about 15–200 angstroms. A polysilicon layer 6 having heavy n type conductive dopant (n+) is deposited by chemical vapor deposition on the gate oxide layer 4.

Figure 2:
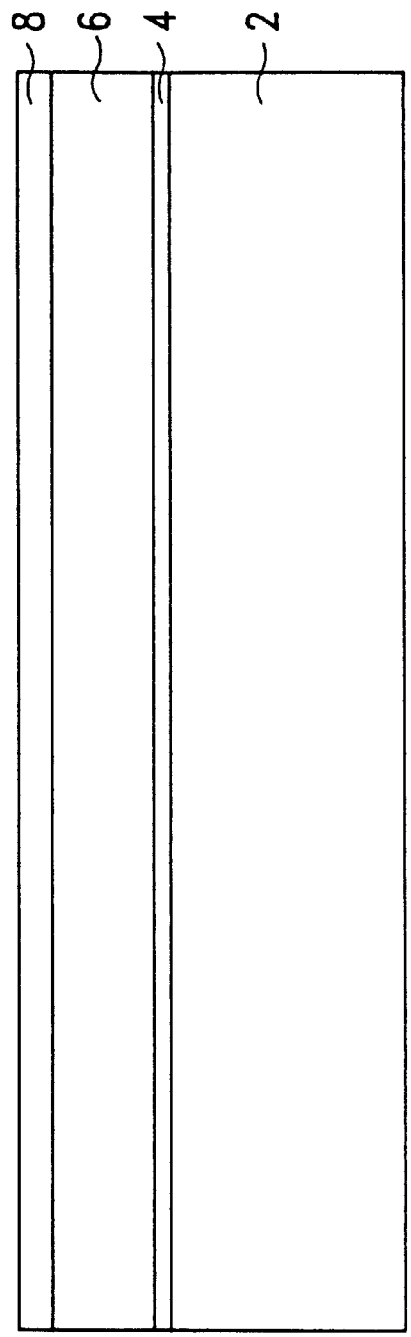
FIG. 2 is a cross-sectional view of a semiconductor substrate illustrating the step of forming a silicon nitride layer on the semiconductor substrate according to the present invention.

A thin silicon nitride layer 8 is deposited on the polysilicon layer 6. The layer 8 is used to serve as an anti-reflective coating (ARC) for subsequent lithography technology to define narrower polysilicon gate, as shown in FIG. 2. In general, the silicon nitride layer 8 can be deposited by any suitable process such as Low Pressure Chemical Vapor Deposition (LPCVD), Plasma Enhance Chemical Vapor Deposition (PECVD), Electron Cycletron Remote Chemical Vapor Deposition (ECRCVD). The thickness of the silicon nitride layer is about 300 to 1000 angstroms. Further, the temperature to form the silicon nitride layer 8 is at a range of 300–800° C. In the preferred embodiment, the reaction gases of the step to form silicon nitride layer 8 are $SiH_4$, $NH_3$, $N_2$, $N_2O$ or $SiH_2Cl_2$, $NH_3$, $N_2$, and $N_2O$.

Figure 3:
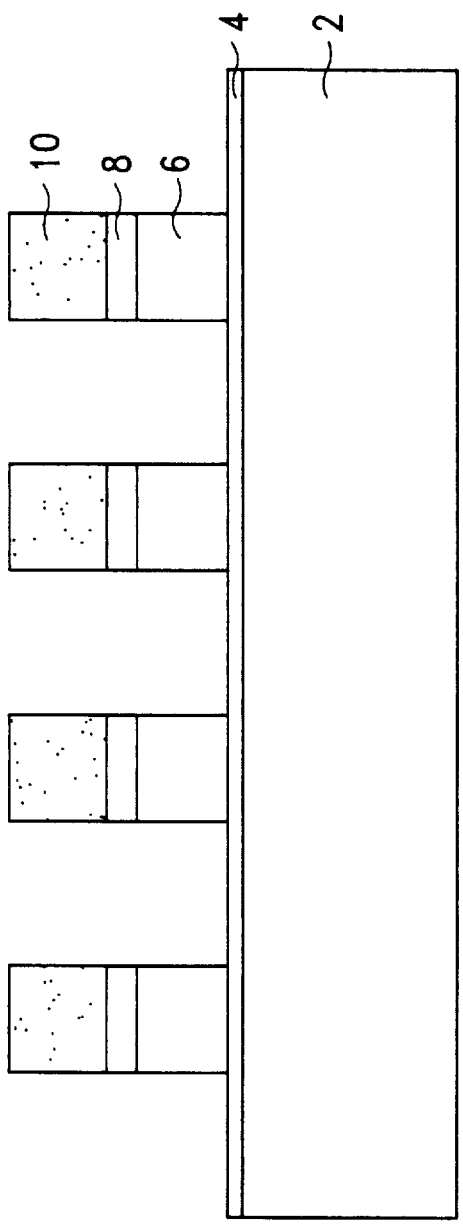
FIG. 3 is a cross-sectional view of a semiconductor substrate illustrating the step of forming word lines on the semiconductor substrate according to the present invention.
Figure 4:
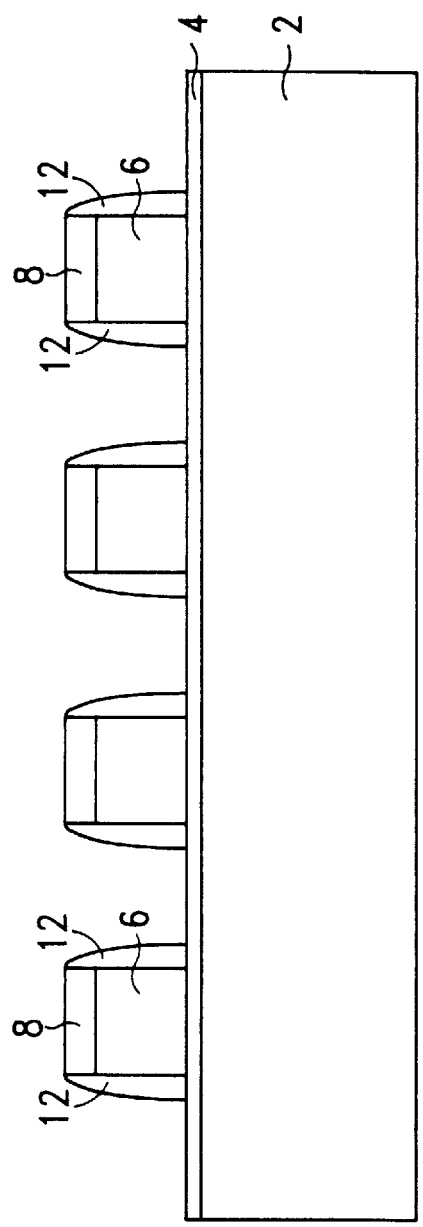
FIG. 4 is a cross-sectional view of a semiconductor substrate illustrating the step of forming spacers on the side walls of the word lines according to the present invention.

Turning to FIG. 3, the silicon nitride layer 8 and the polysilicon layer 6 are patterned to define the gates on the substrate 2 by using a photoresist 10 as a mask. These gate act as word lines. Then, the photoresist 10 is stripped in accordance with a conventional manner. Next, and referring to FIG. 4, nitride spacers 12 are formed on the side walls of the etched polysilicon layer 6 by means of forming a silicon nitride layer then etching the layer. Thereafter, nitride spacers 12 are formed by anisotropic etching.

The next step is to create buried bit lines for both the cell area and the periphery area. In order to provide a clear description herein, the cross-sectional view according to this step will be shown in FIG. 5A and FIG. 5B. FIG. 5A indicates the profile in accordance with the cell area including the coding region 14, whereas FIG. 5B indicates the profile in accordance with the periphery area consisting of n-channel MOS transistors. FIG. 6A and FIG. 6B illustrate the slice of FIG. 5A and FIG. 5B at the next stage during its fabrication, respectively. In the cell area, a photoresist 16 is patterned on the substrate 2 to cover the coding region 14. Then, an ion implantation with n type conductive dopant, such as phosphorus, is carried out to form the source and drain regions to serve as buried bit lines 18 both in the cell area and in the periphery area adjacent to the word lines. The energy and dosage of the implantation are about 0.5 to 100 KeV, 1E14 to 5E16 atoms/$cm^2$, respectively. As shown in FIG. 5A, for the coded NMOS device, the n+ source and drain is shielded with the photoresist 16. Afterwards, the photoresist 16 is stripped away by using well known technology.

Turning to FIG. 6A and FIG. 6B, a high temperature thermal oxidation is performed in an ambient containing oxygen to activate the dopant, thereby forming buried bit lines profile. Simultaneously, a plurality of oxide structures 20 are generated both in the cell area and the periphery area, and on the top of the buried bit lines 18 to isolate the adjacent buried bit lines. Further, an isolation structure 20a is also formed on the coding region 14. Thus, the coded NMOS device has a high resistive source and drain region and only a very small current can be pass the region. This results in a nearly normally off NMOS device when a high level bias is applied to the gate. Preferably, the temperature for this step can range from 800 to 1100 degrees centigrade.

Figure 7:
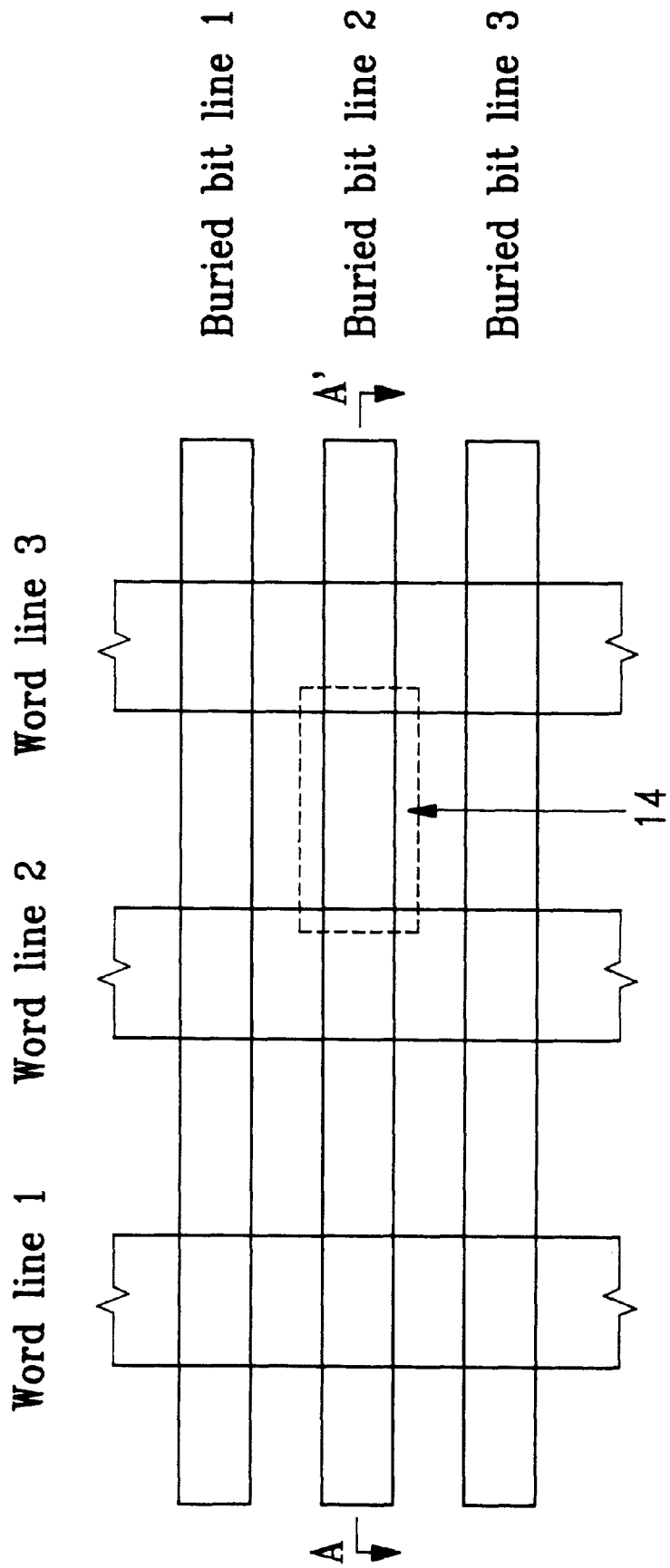
FIG. 7 is a top view of high density buried bit line NAND-gate mask ROM according to the present invention.

FIG. 7 is a mask ROM array scheme according to the present invention, which shows the top view of the high density buried bit line NAND-gate mask ROM. FIG. 6A and FIG. 6B are cross-sectional views taken from the A–A' line of FIG. 7. In FIG. 7, a plurality of vertical lines used as word lines (word line 1, word line 2, word line 3, . . . ) are configured over a substrate. The buried bit lines (buried bit line 1, buried bit line 2, buried bit line 3, . . . ) are arranged vertical to each word lines. A coding region 14 is formed between two adjacent word lines.

As can be appreciated from the above disclosure, the present invention provides the following advantages: (1) The high dosage boron implant induced a lower junction breakdown and a higher leakage current of the conventional coded NMOS devices will be avoided, since the present invention involves no additional channel coding implant; (2) the proposed method can save one mask; (3) the proposed method is easy to control for manufacturing.

As is understood by a person skilled in the art, the foregoing embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a mask ROM (read only memory) device on a semiconductor substrate having a cell area for coding, and a NMOS device area, said mask ROM comprising:

a plurality of NMOS devices formed on said NMOS device area;

a plurality of coded NMOS devices formed on said cell area;

a plurality of first isolation structures formed on said semiconductor substrate between said plurality of NMOS devices and between said plurality of coded NMOS devices;

a second isolation structure formed on said semiconductor substrate between two of said plurality of coded NMOS devices;

a coding region formed on said cell area under said second isolation structure;

bit lines formed under said plurality of first isolation structures;

silicon nitride spacers formed on side walls of said plurality of NMOS devices and said plurality of coded NMOS devices; and anti-reflective coating formed on said plurality of NMOS devices and said plurality of coded NMOS devices, wherein said anti-reflective coating is formed of silicon nitride.

2. The structure of claim 1, wherein said coding region comprises p conductive type ions.

3. The structure of claim 1, wherein said bit lines comprise n conductive type ions.

4. The structure of claim 3, wherein said n conductive type ions comprises phosphorus ions.

5. The structure of claim 1, wherein the thickness of said second isolation is thinner than the one of said plurality of first isolation structures.

6. A structure of a mask ROM (read only memory) device on a cell area of semiconductor substrate for coding, said mask ROM comprising:

a plurality of coded NMOS devices formed on said cell area;

a plurality of first isolation structures formed on said semiconductor substrate between said plurality of coded NMOS devices;

a second isolation structure formed on said semiconductor substrate between two of said plurality of coded NMOS devices;

a coding region formed under said second isolation structure;

n conductive type bit lines formed under said plurality of first isolation structures;

spacers formed on side walls of said plurality of coded NMOS devices, wherein said spacers are formed of silicon nitride; and anti-reflective coating formed on said plurality of coded NMOS devices, wherein said anti-reflective coating are formed of silicon nitride.

7. The structure of claim 6, wherein said coding region comprises p conductive type ions.

8. The structure of claim 6, wherein said n conductive type bit lines are formed with phosphorus ions.

9. The structure of claim 6, wherein the thickness of said second isolation is thinner than the one of said plurality of first isolation structures.

10. A structure of a mask ROM (read only memory) device on a semiconductor substrate having a cell area for coding, and a NMOS device area, said mask ROM comprising:

a plurality of NMOS devices formed on said NMOS device area;

a plurality of coded NMOS devices formed on said cell area;

a plurality of first isolation structures formed on said semiconductor substrate between said plurality of NMOS devices and between said plurality of coded NMOS devices;

a second isolation structure formed on said semiconductor substrate between two of said plurality of coded NMOS devices;

a coding region formed on said cell area under said second isolation structure;

bit lines formed under said plurality of first isolation structures;

spacers formed on side walls of said plurality of NMOS devices and said plurality of coded NMOS devices, wherein said spacers are formed of silicon nitride; and anti-reflective coating formed on said plurality of NMOS devices and said plurality of coded NMOS devices, wherein said anti-reflective coating is formed of silicon nitride.

11. The structure of claim 10, wherein said coding region comprises p conductive type ions.

12. The structure of claim 10, wherein said bit lines comprise n conductive type ions.

13. The structure of claim 12, wherein said n conductive type ions comprises phosphorus ions.

14. The structure of claim 10, wherein the thickness of said second isolation is thinner than the one of said plurality of first isolation structures.

* * * * *